United States Patent [19]

Finnes

[11] Patent Number: 4,588,890
[45] Date of Patent: May 13, 1986

[54] APPARATUS AND METHOD FOR COMPOSITE IMAGE FORMATION BY SCANNING ELECTRON BEAM

[75] Inventor: Steven J. Finnes, Rochester, Minn.

[73] Assignee: International Business Machines Corporation, Armonk, N.Y.

[21] Appl. No.: 687,887

[22] Filed: Dec. 31, 1984

[51] Int. Cl.⁴ ............................................. G01N 23/00
[52] U.S. Cl. ..................................... 250/307; 250/310
[58] Field of Search ............... 250/306, 307, 310, 397, 250/491.1, 492.2, 492.21

[56] References Cited

U.S. PATENT DOCUMENTS

| | | | |
|---|---|---|---|
| 3,329,813 | 7/1967 | Hashimoto | 250/310 |
| 3,920,990 | 11/1975 | Van Nieuwland et al. | 250/310 |
| 4,177,379 | 12/1979 | Furukawa et al. | 250/310 |
| 4,217,495 | 8/1980 | Robinson | 250/310 |
| 4,219,731 | 8/1980 | Migitaka et al. | 250/310 |
| 4,308,457 | 12/1981 | Reimer | 250/310 |
| 4,535,249 | 8/1985 | Reeds | 250/491.1 |

OTHER PUBLICATIONS

*Jour. of Physics Sect. E, Scien. Inst.,* "Computer-Controlled Electron Beam Microfabrication Machine With a New Registration System", Saitou et al., Jan. 1974, pp. 441–444.

*Scanning Electron Microscopy and X-Ray Micro Analysis,* Chapter 4, 1981, pp. 146–151.
"New Scanning Electron Microscope Depends on Multi-Function Detector", Jackman, *Industrial Research and Dev.,* vol. 22, pp. 115–120, Jun. 1980.
"Improved Conditions for Back-Scattered Electron SEM Micrographs on Polished Sections Using a Modified Scintillator Detector", Schur et al., *Scanning Electron Microscopy Conf.,* Apr. 1974, pp. 1,003–1,010.

*Primary Examiner*—Bruce C. Anderson
*Attorney, Agent, or Firm*—Sughrue, Mion, Zinn, Macpeak & Seas

[57] ABSTRACT

An electron beam transversely scans a planar surface having a longitudinal structure projecting therefrom. Two Everhart-Thornley detectors are positioned on transversely opposite sides, respectively, of the structure. During a first scan, only one detector is turned ON to produce a first electric signal having a pronounced amplitude dip corresponding to the structure's bottom edge which is facing away from the ON detector. During the next scan, only the other detector is turned ON to produce a second electric signal having a pronounced amplitude dip corresponding to the structure's other bottom edge which is now facing away from the ON detector. The two signals are combined to produce a composite signal whose waveform comprises two enhanced and segmented dips corresponding precisely to the locations of the structure's two bottom edges.

15 Claims, 5 Drawing Figures

APPARATUS AND METHOD FOR COMPOSITE IMAGE FORMATION BY SCANNING ELECTRON BEAM

BACKGROUND OF THE INVENTION

1. Field of the Invention

This invention relates generally to the field of scanning electron microscopes (SEM) and, more particularly, to an SEM apparatus and a method for scanning an electron beam across a topographical feature on a planar surface and delecting resulting secondary electrons which are collected by a pair of oppositely disposed electron detectors which are alternately switched on and off to produce first and second electric signals which are combined to produce a composite electric signal which provides an enhanced, symmetrical image of the junctures of the planar surface with the opposite lower edges of the topographical feature, which enhanced image can be used to determine very small widths of topographical features such as very narrow conductive coatings on a semiconductor substrate.

2. Description of the Prior Art

Goldstein et al have described the use of an Everhart-Thornley (E-T) scintillator-photomultiplier electron detector in scanning electron microscopy. An E-T detector is generally cylindrical in shape and contains a scintillator material which converts impinging electrons to photons which are conducted to a photomultiplier which produces an electric signal corresponding to the intensity of the collected electrons. When an electron beam strikes the surface of a specimen, both secondary electrons and backscattered (reflected) beam electrons escape the specimen. Secondary electrons are emitted with an average energy of 3–5 eV. In a typical SEM, the electron beam has an energy of, for example, 20 keV, and the backscattered beam electrons have a much higher energy than the secondary electrons which are emitted. Furthermore, the backscattered electrons are highly directional, and their directions are not affected by the positive bias voltage on the Faraday cage of an E-T detector. In fact, when only backscattered electrons are to be detected, the cage bias voltage is not required, as the E-T detector will collect all backscattered electrons whose take-off angles are within the range of the detector's solid angle of collection. However, when it is desired to collect secondary electrons, a positive bias potential up to as +300 V is placed on the Faraday cage. ("Scanning Electron Microscopy and X-ray Micro Analysis", Plenum, 1981, pages 146–151).

Jackman has described the use of a plurality of E-T detectors for detecting backscattered beam electrons. Through the use of optical switches, the signals from these detectors can be viewed individually to give asymmetric detection, summed to give the equivalent of a large symmetric detector, or subtracted (Jackman, J., June 19, 1980; *Industrial Research and Deveopment,* Vol. 22, page 115).

Saitou et al have described a digital computer-controlled electron beam microfabrication system for recording submircometer patterns by an electron resist on a semiconductor wafer. Registration of the beam is achieved by detecting backscattered electrons to locate the positions of registration or reference marks on the wafer. (*Journal of Physics, Sect. E, Scientific Instruments,* Vol. 7, Jan. 1974, pages 441–444).

Schur et al have described an SEM including a modified E-T scintillator-photomultiplier for detecting backscattered electrons in quantitative image analysis (stereology) of plane-polished sections. ("Improved Conditions for Back-Scattered Electron SEM Micrographs on Polished Sections Using A Modified Scintillator Detector", Conference, Scanning Electron Microscopy/1974, IIT Research Institute, Chicago, Ill., Apr. 8–11, 1974, pages 1,003–1,010).

Furukawa et al in U.S. Pat. No. 4,177,379 have described a backscattered electron detector for use in an electron microscope or electron beam exposure system, and including a scintillator for converting backscattered electrons to light, and a converter for converting the light to corresponding electric signals. FIGS. 5 and 6 show the use of the detector in an electron beam exposure system for locating a reference groove in a semiconductor substrate during the formation of a mask pattern using an electron beam resist.

Reimer in U.S. Pat. No. 4,308,457 has described an electron microscope which an electron beam impinges upon a specimen, and including a detector for separately detecting the secondary electrons released from a specimen and the secondary electrons produced by the beam electrons backscattered specimen.

Van Nieuwland et al in U.S. Pat. No. 3,920,990 have described an ion-scattering spectrometer including an ion beam source for directing an ion beam onto the surface of a material to be analyzed, a diaphragm-aperture for passing ions backscattered from the surface only at a particular angle, and a detector for measuring the kinetic energy of the passed backscattered ions.

Robinson has described in U.S. Pat. No. 4,217,495 an SEM having a particular scintillator structure for improving the collection of backscattered electrons.

SUMMARY OF THE INVENTION

The primary object of the invention is to provide an improved apparatus and method for obtaining an enhanced and symmetrical electric signal image of the bottom edges of a structure projecting from a planar surface.

Another related object is to provide such an apparatus and method for determining very small line widths of a topographical feature on a semiconductor substrate.

These objects are accomplished by transversely scanning with an electron beam of an SEM a longitudinally extending structure on a planar surface. Two E-T detectors are placed on transversely opposite sides, respectively, of the longitudinal structure. The electron beam is first scanned along a line transversely across the structure with one detector ON and the other detector OFF to produce an electric signal whose waveform shows a pronounced amplitude change produced by the secondary electrons collected from the structure's bottom edge which is the more remote from the ON detector. Then, the electron beam is transversely scanned along the same line with the one detector OFF and the other detector ON to produce a second electric signal whose waveform shows a pronounced amplitude change produced by secondary electrons collected from the structure's other bottom edge which is now the more remote from the ON detector. The two electric signals are combined to produce a composite electric signal having a waveform which has enhanced and symmetrical amplitude changes accurately corresponding to the two bottom edges of the structure. The composite signal may be fed to a CRT monitor for observing the image of the structure, or processed and then fed to a computer automated line-width measurement algorithm to produce a line width measurement. The electron beam is chosen to be of sufficiently low energy such that the specimen, such as a semiconductor, being scanned is not damaged by the beam. A positive bias voltage is placed on the Faraday cages of the two E-T detectors, and the image of the back or remote side of the structure is produced predominately by secondary electrons emitted from this back or remote side. Apparently, the structure, itself, "shades" or blocks from the more remote detector any beam electrons which are backscattered from the remote or back side of the structure. Because of the bias on each of the opposing detectors, it may be necessary to calibrate the digital scan line so that any beam displacement due to the opposing detectors is nullified.

DETAILED DESCRIPTION OF THE PREFERRED EMBODIMENT

Figure 1:
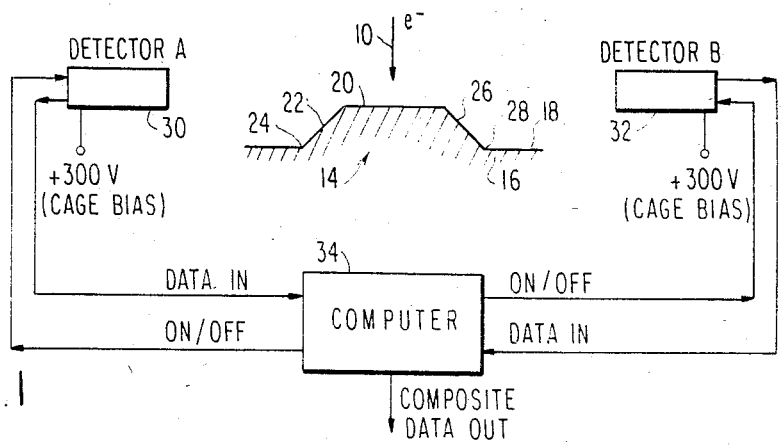
FIG. 1 is a schematic diagram of a preferred embodiment of the apparatus of the invention and also illustrates the basic method of the invention.

FIG. 1 is a schematic diagram illustrating the physical relationships of the components of the apparatus of the invention and also illustrating the method of the invention. More specifically, an electron beam 10 from an SEM scans in a transverse direction a specimen 14 shown in cross section. This specimen consists of a substrate 16 having a planar surface 18 from which protrudes a longitudinally extending structure or topographical feature 20. As illustrated, the structure or feature 20 has a left-hand edge 22 forming a juncture 24 with the planar surface 18, and a righthand edge 26 forming a juncture 28 with the planar surface 18. The edges 22 and 26 are illustrated as slanted edges, but they may be vertical. It is known that the number of secondary electrons emitted by a surface struck by an electron beam is at a maximum for surfaces parallel to the beam, decreases for surfaces perpendicular to the beam and is at a minimum at junctures 24 and 28.

Two E-T scintillator-photomultiplier detectors 30 and 32 are disposed within an SEM such that their respective longitudinal axes are parallel to the planar surface and such that they are located on transversely opposite sides, respectively, of the longitudinally extending structure 20. The E-T detector 30 on the left side is designated detector A, and the E-T detector 32 on the right side is designated as detector B. Since this invention depends upon the collection of secondary electrons, up to +300 V bias is applied to the Faraday cage of each of the detectors 30 and 32. A computer 34 controls the On/Off operation of the detector 30 and 32 in accordance with this invention, receives from both of the detectors 30 and 32 data in the form of electric signals representing the intensity of the electrons collected by the respective detectors, and processes this data to output composite data in the form of either an enhanced and symmetrical minimum composite signal representing the image of the scanned structure or else as a line-width signal, as will be described in more detail below.

For semiconductor specimens and other specimens which may be damaged by the relatively high electron beam energy of a conventional SEM, the SEM must be designed to have an electron beam energy of 2.5 keV or below. Such specimens would be, for example, silicon, aluminum, photoresist, etc. However, for specimens which would not be damaged by high energy scanning electron beams, the invention is just as appicable to electron beams of 25–30 keV as found in a conventional SEM used for specimen analysis. Furthermore, even though detectors 30 and 32 are shown as being parallel to the planar surface 18, their actual orientations are determined by the SEM manufacturer and are not critical to the operation of this invention. In a typical SEM, the detectors 30 and 32 would be fixed, and the specimen is appropriately positioned between the detectors for transverse scanning by the electron beam 10. Furthermore, even though the cage bias is illustrated as being +300 V, it may be any positive voltage up to +300 V.

Figure 2:
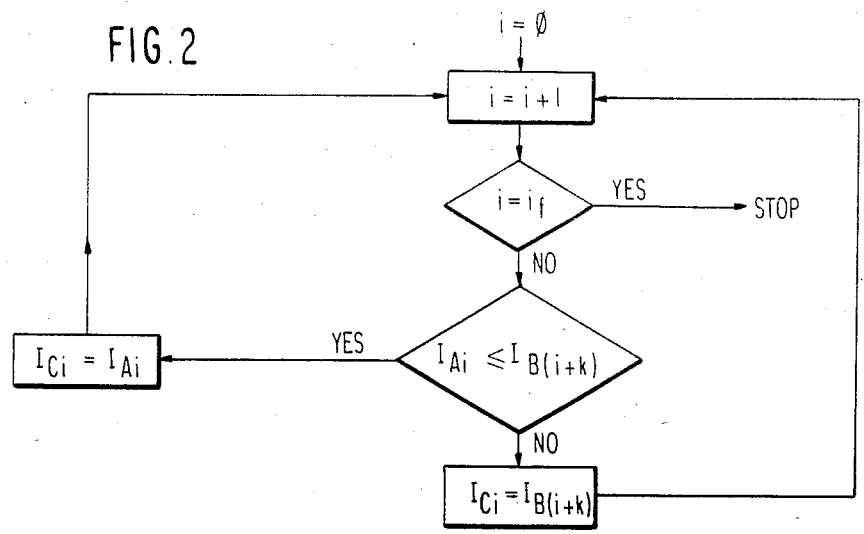
FIG. 2 is a flow chart illustrating the algorithm used for combining the signals from the two E-T detectors to form a minimum composite signal which represents an enhanced and symmetrical image of the scanned edges of a structure on a planar surface.

The method of this invention and the operation of the apparatus illustrated in FIG. 1 are based on the novel principle of forming an enhanced and symmetrical composite image of the structure's side edges by utilizing only the data signals from the respective sides of the structure which face away, or are more remote, from the ON E-T detector. With reference to FIG. 1, this principle is achieved by transversely scanning along a line with only one of the detectors 30 and 32 ON, and then scanning along the same line with only the other detector ON. It was discovered that the resulting waveforms from detectors A and B each have a pronounced or enhanced dip in amplitude at the point corresponding to the structure's bottom edge which is the more remote from the ON detector. The signal waveforms from the two detectors are then combined in accordance with an algorithm illustrated by the flow chart of FIG. 2 to produce a minimum composite signal having symmetrical and enhanced or pronounced dips corresponding exactly to the junctures 24 and 28 of the structure's bottom edges with the planar surface 18 of specimen 14.

More specifically, the apparatus shown in FIG. 1 will perform the function of forming a symmetrical composite image which utilizes only the detector signal corresponding to the secondary electrons collected from the structure's side facing away from the ON E-T detector and the usual signal from the surfaces not obstructed by roughness. The computer 34 first switches ON one of the two opposing E-T detectors 30 and 32 and collects an array of digital image intensity values as a function of beam position. The computer then switches OFF this detector and switches ON the opposite detector to collect another array of digitial values, each of which corresponds positionally to the values in the first array. The composite "shadow" edge image is formed by comparing the corresponding array values from the two detectors 30 and 32 and then storing the lower or minimum of the two values in a third array; if the two values are equal, the computer stores either of the two values, as illustrated by the flow chart of FIG. 2 in which $I_{Ai}$ is the intensity value from and stored at position or address i from detector A, $I_{Bi}$ is the equivalent information from detector B (when detector B is ON), k is a calibration constant for any offset beam displacement due to detector bias, and $I_{Ci}$ is the composite image array.

Figure 3:
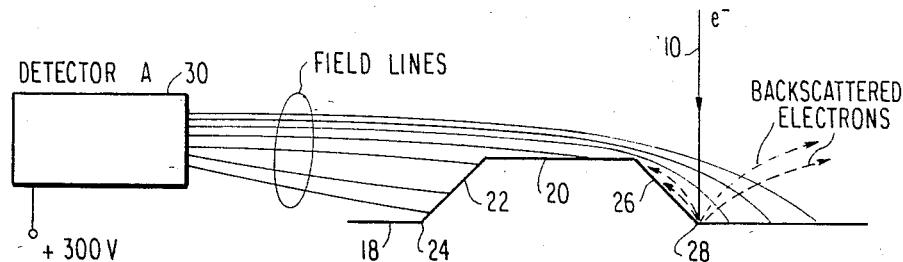
FIG. 3 is a schematic diagram illustrating a possible explanation of the unobvious resuts obtained by this invention.

Investigation of both micrographs and computer line scan profiling have demonstrated this "shadow" effect from the structure's side facing away from the ON detector. A possible explanation of the shadow is that any backscattered electrons from the back or remote side of the structure 20 are blocked or shaded from reaching the more remote ON detector. In addition to this shadow effect, the 300 V field lines from the detector tend to be curved and, therefore, weakened, thus allowing for a wider range of higher velocity escape electrons to be unaffected and, therefore, not collected, as schematically illustrated in FIG. 3. Since secondary electrons are defined as those electrons with energies below 50 ev, it is apparent that the secondary electrons will be collected regardless of the relative positions of the detectors. Thus, it seems reasonable that the shadow is more purely a secondary electron image void of many of the higher energy backscattered beam electrons.

Figure 4:
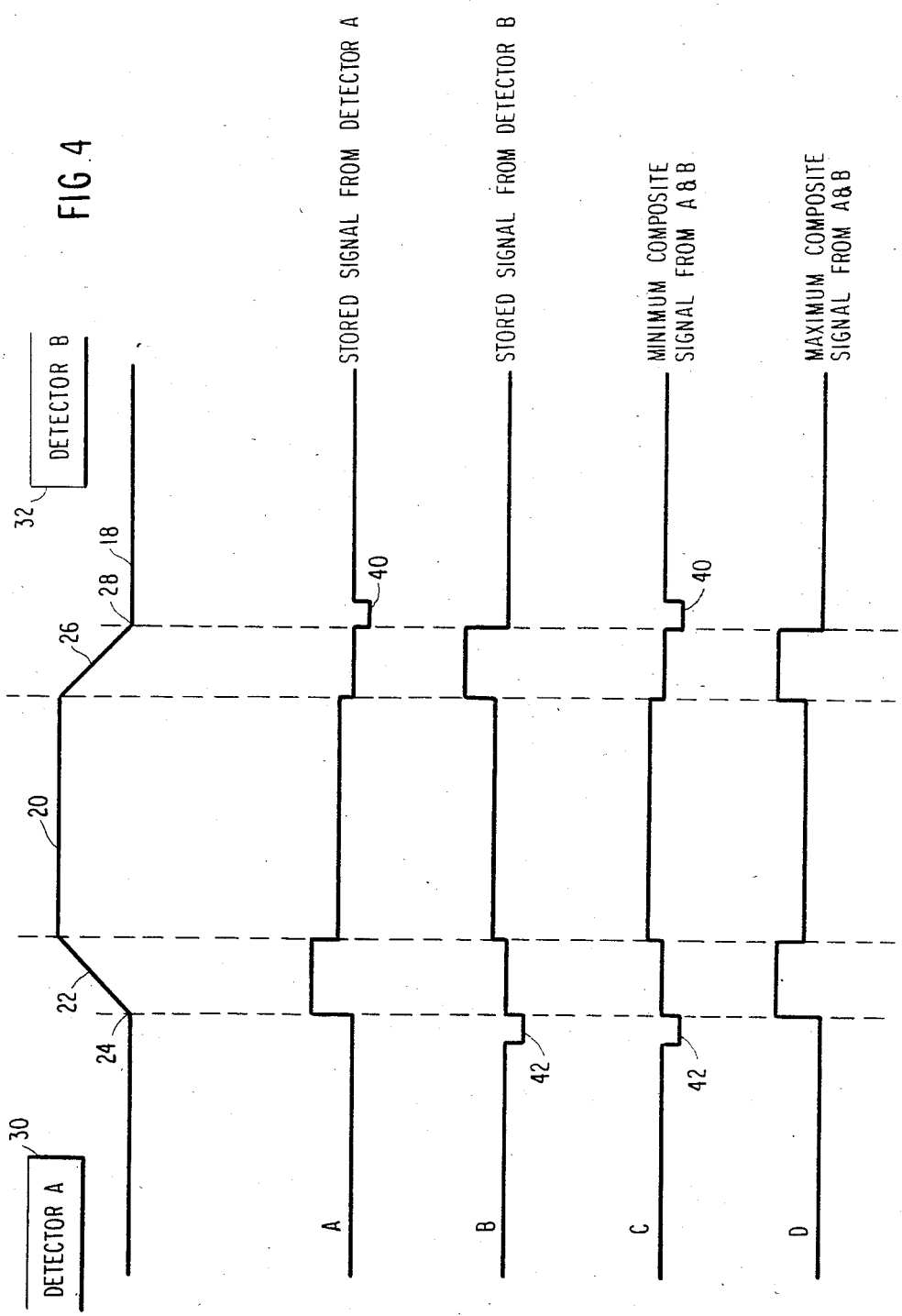
FIG. 4 illustrates various idealized signal waveforms relative to the E-T detectors and to the structure being scanned and shows the manner in which the electric signals from the two E-T detectors are processed to form the minimum composite signal representing the enhanced and symmetrical image of the structure being scanned.

FIG. 4 shows the relationship between the crosssection of structure 20, the stored signals from the detectors A and B, and the composite signals formed by the practice of this invention. Waveform A represents the signal output from detector A (when detector A is ON) and has a pronounced dip 40 or reduction in amplitude at the point corresponding to the bottom edge or juncture 28 of the edge 26 and the planar surface 18, the edge 26 facing away from the ON detector 30. Similarly, waveform B represents the signal from detector B from the next transverse scan (when detector B is ON, and detector is OFF); here, the dip 42 corresponds to the juncture 24 of the edge 22 and the planar surface 18, the edge 22 facing away from the ON detector B. Waveform C represents the enhanced and symmetrical minimum composite signal formed by combining waveforms A and B in accordance with the foregoing algorithm; i.e., waveform C is formed by choosing at each point thereof the lower of the corresponding values of waveforms A and B. If desired, a maximum composite signal waveform D may be formed by choosing the higher of the values of waveforms A and B.

Figure 5:
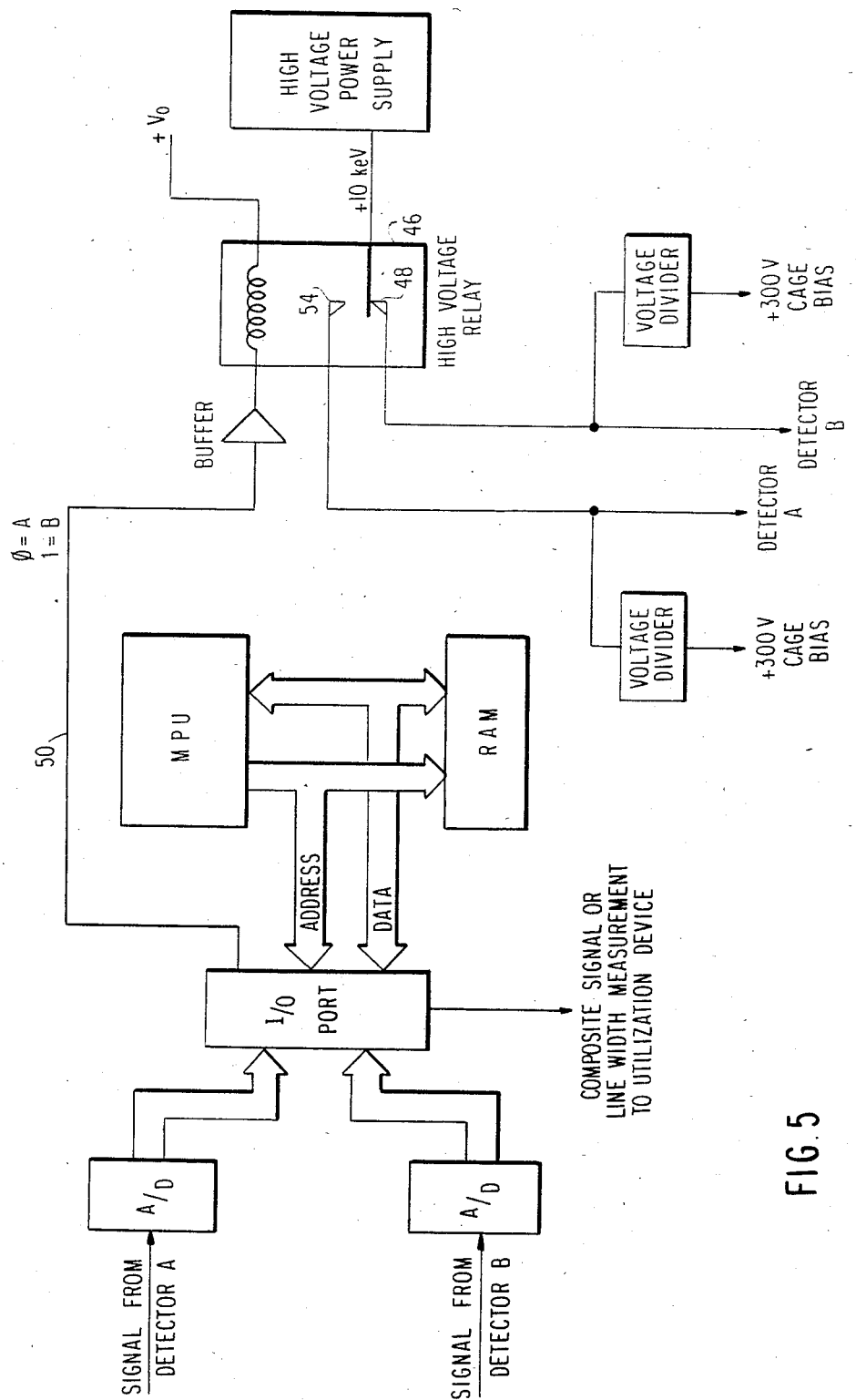
FIG. 5 is a schematic block diagram illustrating one form of a control and signal processing system for operating the apparatus of this invention in accordance with the method of this invention.

FIG. 5 is a schematic block diagram illustrating typical components required for alternately switching ON and OFF the detectors A and B and for storing the detector data signals in a RAM which also stores the necessary algorithms. A high voltage relay 46 has a normally closed lower contact 48 which normally supplies the operating and bias voltages to detector B. The analog signal from detector B is converted to a digital signal by an A/D converter and fed to an I/O port which outputs a logical 1 signal on line 50 to open relay contact 48 and close the upper relay contact 54, thereby supplying operating voltage to detector A. Thus, the detectors are alternately switched ON and OFF for successive scans of the electron beam of the SEM to provide the detector operation required for this invention. The signals are stored in the RAM and the MPU provides the signal processing/combining operation described above to produce either an image signal or a line-width measurement.

In summary, then, this invention solves two distinct problems: it removes the detector-induced signal asymmetry of the prior art and allows for the enhancement of the image of the bottom edge of both sides of a scanned structure for computer-automated line width measurements. Essential features of the invention are that the detectors A and B be located on transverely opposite sides of the structure being scanned and that the detectors be alternately switched ON and OFF for successive scans as described above. The intensity value for each scan position is stored in a corresponding RAM location for each detector. The signal outputs from the two detectors are compared at each location to form a new composite minimum or maximum signal depending upon the desired results. This composite signal image is virtually independent of bias due to the detectors (in the axis of detector orientation).

I claim:

1. A method of producing an electric signal representing a precise image of the junctures of a planar surface of a specimen and the two edges of a longitudinally extending projection on the planar surface, the method comprising the steps of:

positioning first and second electron detectors on opposite transverse sides, respectively, of the projection;

transversely scanning a first electron beam along a line across the planar surface, including the projection, and detecting, with only said first detector, electrons escaping from the scanned surface, including secondary electrons, to produce a first electric signal representing the electrons detected by only said first detector;

transversely scanning a second electron beam along the line across the planar surface, including the projection, and detecting, with only said second detector, electrons escaping from the scanned surface, including secondary electrons, to produce a second electric signal representing the electrons detected by only said second detector; and combining said first and second electric signals to produce a composite electric signal having pronounced symmetrical characteristics corresponding precisely to the locations of the two junctures.

2. A method as defined claim 1 further comprising the steps of:

during the scanning of said first electron beam, turning ON said first detector and turning OFF said second detector; and during the scanning of said second electron beam, turning OFF said first detector, and turning ON said second detector.

3. A method as defined in claim 1 wherein said characteristics are signal amplitudes; and wherein said combining step comprises selecting the lower of the two amplitudes at corresponding points of the first and second signal as the amplitude of each corresponding point of the composite signal.

4. A method as defined in claim 1 wherein said characteristics are signal amplitudes; and wherein said combining step comprises selecting the higher of the two amplitudes at corresponding points of the first and second signals as the amplitude of each corresponding point of the composite signal.

5. A method as defined in claim 1 further comprising the step of feeding the composite signal to a visual image-producing device to produce a visual image of the junctures.

6. A method as defined in claim 1 wherein the specimen is a semiconductor material, and further comprising the step of choosing the energy of the electron beam to be 2.5 keV or less.

7. A method as defined in claim 1 further comprising the step of processing the composite signal to provide a line-width signal corresponding to the distance between the junctures.

8. An apparatus for producing an electric signal representing a precise image of the junctures of a planar surface of a specimen and the two edges of a longitudinally extending projection on the planar surface said apparatus comprising:

first and second electron detector means, positioned on transversely opposite sides of the projection, for producing respective electrical signals corresponding to detected electrons;

control means for controlling said first and second electron detector means such that, during the transverse scanning of a first electron beam along a line across the planar surface, including the projection, only said first detector means detects electrons escaping from the scanned surface, including secondary electrons, to produce a first electric signal representing the electrons detected by only said first detector means, and such that, during the transverse scanning of a second electron beam along the line across the planar surface, including the projection, only said second detector means detects electrons escaping from the scanned surface, including secondary electrons, to produce a second electric signal representing the electrons detected by only said second detector means; and signal processing means for combining the first and second electric signal to produce a composite electric signal having pronounced symmetrical characteristics corresponding precisely to the locations of the two junctures.

9. An apparatus as defined in claim 8 further comprising switching means for turning ON said first detector means and turning OFF said second detector means during the scanning of said first electron beam, and for turning OFF said first detector means and turning ON said second detector means during the scanning of said second electron beam.

10. An apparatus as defined in claim 8 wherein said characteristics are signal amplitudes and wherein said signal processing means comprises means for selecting the lower of the two amplitudes at corresponding points of the first and second signals as the amplitude of each corresponding point of the composite signal.

11. An apparatus as defined in claim 8 wherein said characteristics are signal amplitudes and wherein said signal processing means comprises means for selecting the higher of the two amplitudes at corresponding points of the first and second signals as the amplitude of each corresponding point of the composite signal.

12. An apparatus as defined in claim 8 further comprising a means for feeding the composite signal to a utilization device.

13. An apparatus as defined in claim 8 wherein the specimen is a semiconductor material, and wherein said first and second electron beams are the scanning electron beams of a scanning electron microscope, said first and second electron beams having an energy of 2.5 keV or less.

14. An apparatus as defined claim 8 wherein said first and second electron means are Everhart-Thornley scintillator-photomultiplier electron detectors biased to collect secondary electrons.

15. An apparatus as defined in claim 8 wherein said signal processing means converts said composite signal into a line-width signal representing the distance between the junctures.

* * * * *